United States Patent
Nistler

[19]

[11] Patent Number: 6,072,222
[45] Date of Patent: Jun. 6, 2000

[54] SILICON IMPLANTATION INTO SELECTIVE AREAS OF A REFRACTORY METAL TO REDUCE CONSUMPTION OF SILICON-BASED JUNCTIONS DURING SALICIDE FORMATION

[75] Inventor: John L. Nistler, Martindale, Tex.

[73] Assignee: Advanced Micro Devices, Inc., Sunnyvale, Calif.

[21] Appl. No.: 09/080,659

[22] Filed: May 18, 1998

[51] Int. Cl.$^7$ .................................................. H01L 21/425
[52] U.S. Cl. .......................... 257/383; 438/659; 257/757
[58] Field of Search .................................. 257/754, 755, 257/757, 758, 382, 383, 384; 438/655, 656, 659, 661, 663, 664

[56] References Cited

U.S. PATENT DOCUMENTS

| | | | |
|---|---|---|---|
| 4,120,700 | 10/1978 | Morimoto | 438/479 |
| 4,559,096 | 12/1985 | Friedman et al. | 438/515 |
| 4,743,564 | 5/1988 | Sato et al. | 257/758 |
| 4,929,489 | 5/1990 | Dreschhoff et al. | 428/195 |
| 5,070,046 | 12/1991 | Hu | 501/9 |
| 5,111,355 | 5/1992 | Anand et al. | 257/296 |
| 5,142,438 | 8/1992 | Reinberg et al. | 257/304 |
| 5,186,718 | 2/1993 | Tepman et al. | 29/25.01 |
| 5,246,884 | 9/1993 | Jaso et al. | 438/693 |
| 5,281,554 | 1/1994 | Shimada et al. | 438/685 |
| 5,304,503 | 4/1994 | Yoon et al. | 438/258 |
| 5,552,337 | 9/1996 | Kwon et al. | 438/396 |
| 5,677,015 | 10/1997 | Hasegawa | 438/785 |

OTHER PUBLICATIONS

Yamada et al. "Gas Cluster Ion Beam Processing for ULSI Fabrication," Reprinted from MatErials Research Society Symposium Proceedings vol. 427, Advanced Metallization for Future ULSI.

RaaijamAkers "Low Temperature Metal—Organic Chemical Vapor Deposition of Advanced Barrier Layers for the Microelectronics Industry," *Thin Solid Films*, 247 (1994) pp. 85–93.

Huang, et al, "The Influence of Ge–Implantation on the Electrical Characteristics of the Ultra–Shallow Junction Formed by Using Silicide as a Diffusion Source," IEEE Electron Device Letters, vol. 17, No. 3, Mar. 1996, pp. 88–90.

*Primary Examiner*—Olik Chaudhuri
*Assistant Examiner*—Anh Duy Mai
*Attorney, Agent, or Firm*—Kevin L. Daffer; Conley, Rose & Tayon

[57] ABSTRACT

An integrated circuit fabrication process is provided for implanting silicon into select areas of a refractory metal to reduce the consumption of silicon-based junctions underlying those select areas during salicide formation. The refractory metal is subjected to a heat cycle to form salicide upon the junctions and polycide upon the upper surface of a gate conductor positioned between the junctions. In response to being heated, the metal atoms readily react with implanted silicon atoms positioned proximate the metal atoms to form salicide. Once a metal atom has reacted with implanted silicon atoms, it is no longer available to react with silicon atoms of the junctions. However, not all of the metal atoms react with implanted silicon atoms, so some of the metal atoms are free to react with the silicon atoms of the junctions. Interdiffusion and reaction between those available metal atoms and those silicon atoms of the junctions occurs as a result of heating the semiconductor topography. The junctions thus may be partially consumed, ensuring that a low resistance pathway is formed between the salicide and the junctions. Advantageously, the remaining portions of the junctions are sufficiently large to prevent junction spiking entirely through the junctions to the bulk substrate underlying the junctions. In fact, so little of the junctions are consumed during salicide formation that the junction depth may be minimized without suffering increased junction leakage due to junction spiking.

6 Claims, 5 Drawing Sheets

SILICON IMPLANTATION INTO SELECTIVE AREAS OF A REFRACTORY METAL TO REDUCE CONSUMPTION OF SILICON-BASED JUNCTIONS DURING SALICIDE FORMATION

BACKGROUND OF THE INVENTION

1. Field of the Invention

This invention relates to integrated circuit fabrication and, more particularly, to a method for implanting silicon into select areas of a refractory metal to reduce the consumption of silicon-based junctions underlying those select areas during salicide formation.

2. Description of the Related Art

Fabrication of an integrated circuit involves numerous processing steps. After impurity regions have been placed within a semiconductor substrate and gate areas defined upon the substrate, an interlevel dielectric is formed across the topography to isolate the gate areas and the impurity regions. Interconnect routing is then placed across the semiconductor topography and connected to the impurity regions and/or the gate areas by ohmic contacts formed through the interlevel dielectric. The entire process of making ohmic contacts to the impurity regions and/or the gate areas and routing interconnect material between the ohmic contacts is described generally as "metallization". As the complexity of integrated circuits has increased, the complexity of the metallization composition has also increased. Conductive materials other than metal are commonly used for metallization. As such, the term metallization is generic in its application.

Integrated circuits often employ active devices known as transistors. A transistor includes a pair of impurity regions, i.e., junctions, spaced apart by a gate conductor which is dielectrically spaced above the substrate within which the junctions reside. The junctions contain a dopant species opposite in type to that of a channel region residing underneath the gate conductor. Formation of an ohmic contact through an interlevel dielectric to a junction involves patterning a protective mask upon areas of the interlevel dielectric exclusive of where the ohmic contact is to be formed. The area of the interlevel dielectric left uncovered by the mask is then etched to form an opening or window directly above the junction to which contact is to be made. The contact window is then filled with a conductive material. Unfortunately, the mask, and hence the contact, may be misaligned with the junction, resulting in increased resistance at the interface between the contact and the junction.

It has therefore become necessary to incorporate self-aligned, low resistivity structures between the contact windows and the junctions to ensure that contact is made to the entire area of the junction. More specifically, low resistivity structures referred to as self-aligned suicides, or salicides are commonly formed upon the junctions of a silicon-based substrate. A salicide process involves depositing a refractory metal across the semiconductor topography, and then reacting the metal only in regions where a high concentration of silicon atoms are present. In this manner, salicides may be formed exclusively upon the junctions and the upper surface of a polycrystalline silicon ("polysilicon") gate conductor interposed between the junctions. Salicide formed upon polysilicon is generally referred to as polycide. Regions between the junctions and the sidewall surfaces of the gate conductor may be pre-disposed with dielectric sidewall spacers generally formed from silicon dioxide ("oxide"). The sidewall spacers serve to prevent the metal deposited across the semiconductor topography from contacting, and hence reacting with, the polysilicon at the sidewall surfaces of the gate conductor. Absent the sidewall spacers, silicide could form upon the sidewall surfaces of the gate conductor, undesirably shorting the gate conductor to the adjacent junctions.

Unfortunately, silicide formation upon the dielectric sidewall spacers is still possible in some situations. In particular, when titanium is used as the refractory metal, annealing the titanium within a conventional furnace at temperatures above about 700° C. may lead to lateral interdiffusion between the titanium atoms and the silicon atoms of the spacers. It is believed that the silicon atoms are provided from broken Si—O bonds. The titanium atoms and the silicon atoms readily react to form $TiSi_2$ upon the sidewall spacers. The lateral formation of silicide between the gate conductor and the junctions can "bridge" the separation between the structures, causing the gate to be shorted to the junctions. To overcome this problem, a two-step anneal process may be employed to form titanium salicide. The first anneal step forms a first phase $TiSi_2$ at a relatively low temperature of less than 700° C. to prevent substantial interdiffusion between the titanium and silicon within the adjoining sidewall surfaces. The unreacted titanium is then removed from the non-silicon-based surfaces, e.g., the sidewall spacers, in the interim between the first and second anneal steps. The second anneal step may then be performed at a temperature greater than 800° C. to form a second phase $TiSi_2$ having a lower resistance than the first phase.

Device dimensions of an integrated circuit are continuously being reduced to afford increased circuit speed and complexity. As the distance between the source junction and the drain junction of a transistor (i.e., the physical channel length) decreases, the junction areas must also be reduced to prevent unwanted source/drain-tosubstrate junction capacitance. Unfortunately, as junctions become more shallow, e.g., less than 1,000 Å in depth, consumption of the silicon within the junctions may lead to problems. In particular, conventional salicide processing typically results in 100 Å to 200 Å of a junction being consumed. Interdiffusion between silicon of the junctions and the refractory metal, particularly titanium, can be so extensive that in some instances the metal can "spike" through relatively shallow junctions. As a result of the metal penetrating below the depth of the junctions into the bulk substrate, the junctions may experience large current leakage or even become electrically shorted. These problems may become paramount as junction depth continues to decrease to below 500 Å.

Figure 1:
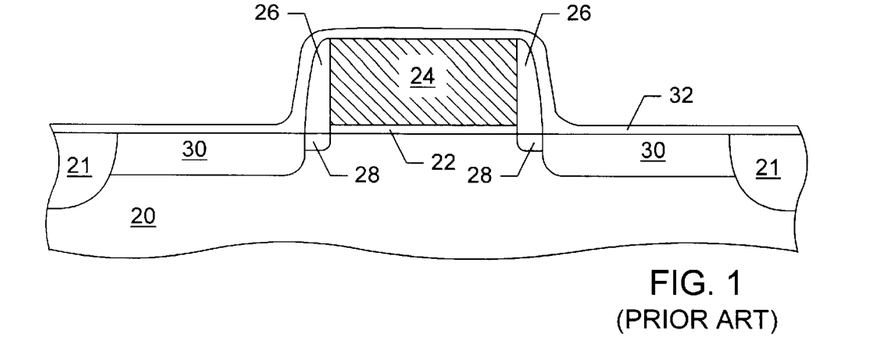
FIG. 1 depicts a partial cross-sectional view of a semiconductor topography according to a conventional design, wherein a relatively thin layer of amorphous Si is deposited across a transistor arranged upon and within a semiconductor substrate.
Figure 2:
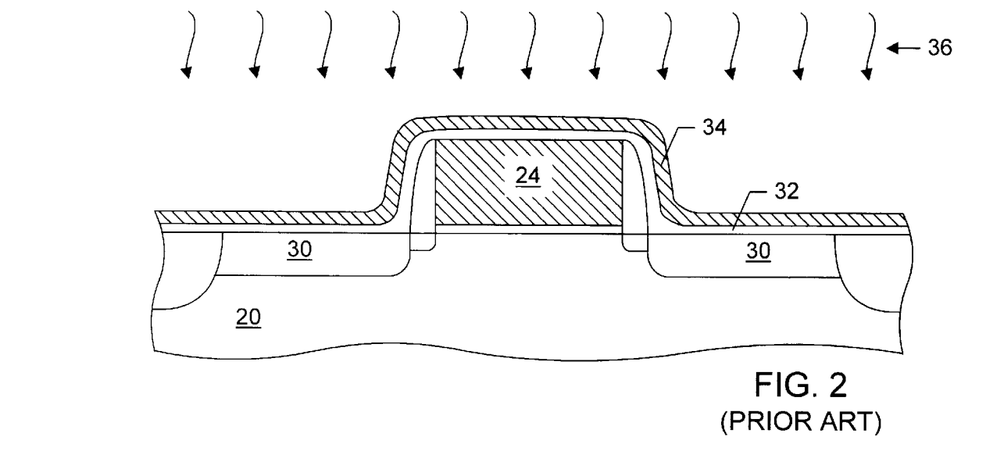
FIG. 2 depicts a partial cross-sectional view of the semiconductor topography, wherein a layer of metal is deposited across the layer of amorphous Si and heated to cause the metal to react with Si in the amorphous layer and with Si within the source and drain regions and the gate conductor of the transistor, subsequent to the step in FIG. 1.
Figures 3A, 3B:
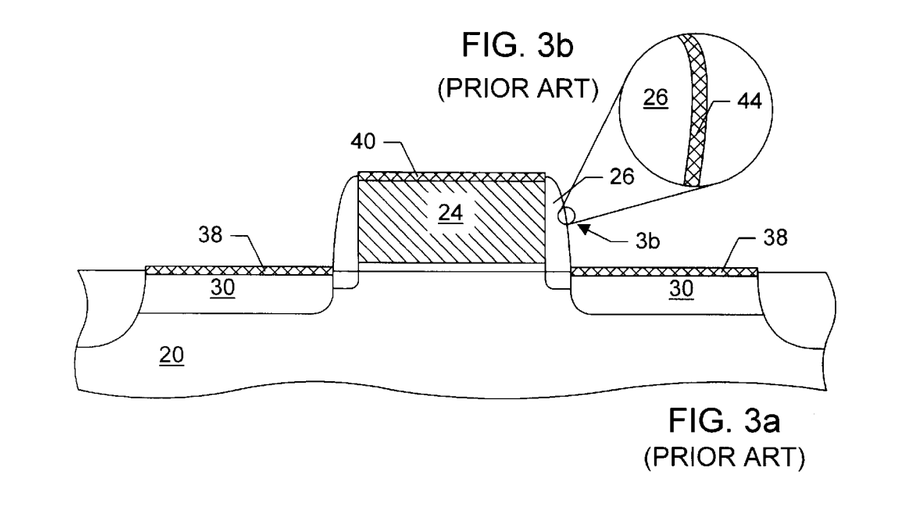
FIG. 3a depicts a partial cross-sectional view of the semiconductor topography, wherein salicide is formed upon the source and drain region and polycide is formed upon the upper surface of the gate conductor as a result of the step shown in FIG. 2.
FIG. 3b depicts a detailed view along section 3b of FIG. 3a, wherein silicide has undesirably formed upon the surface of an oxide sidewall spacer extending laterally from the gate conductor.

Various techniques have been developed to minimize the occurrence of junction spiking. FIGS. 1–3 depict one of these techniques. FIG. 1 illustrates a silicon-based substrate 20 upon and within which a transistor has been formed. The transistor is bounded by field isolation structures 21 which have been formed using a shallow trench isolation process. A polysilicon gate conductor 24 is spaced above substrate 20 by a gate oxide 22. Oxide sidewall spacers 26 extend laterally from the opposed sidewall surfaces of gate conductor 24. Lightly doped drain ("LDD") areas 28 of substrate 20 are arranged directly beneath sidewall spacers 26. Source and drain regions 30 are positioned within substrate 20 laterally between LDD areas 28 and field isolation structures 21. Source and drain regions 30 and LDD areas 28 form graded junctions within substrate 20 which increase in dopant concentration in a lateral direction away from gate conductor 24. According to the more modern salicidation process, a relatively thin layer (less than 100 Å) of amorphous silicon 32 (i.e., α Si) is deposited across the semiconductor topography.

As shown in FIG. 2, a refractory metal 34 is then deposited across the layer of amorphous silicon 32. Refractory metal 34 is subjected to a thermal cycle 36 to promote the formation of silicide upon heavily concentrated silicon-based surfaces. Since metal atoms can react with silicon atoms of the adjacent amorphous layer 32 rather than with silicon atoms of substrate 20 the depletion of source and drain regions 30 is reduced. As depicted in FIG. 3a, the unreacted portions of refractory metal 34 may be removed while salicide structures 38 are retained upon source and drain regions 30 and polycide structure 40 is retained upon the upper surface of gate conductor 24. While the amorphous layer of silicon 32 is relatively thin, its presence upon sidewall spacers 26 can lead to the formation of silicide upon the spacers. FIG. 3b depicts a detailed view along section 3b of FIG. 3a in which such a silicide layer 44 has been formed upon sidewall spacer 26. Silicide layer 44 could undesirably form a conductive path between gate conductor 24 and source and drain regions 30.

Figure 4:
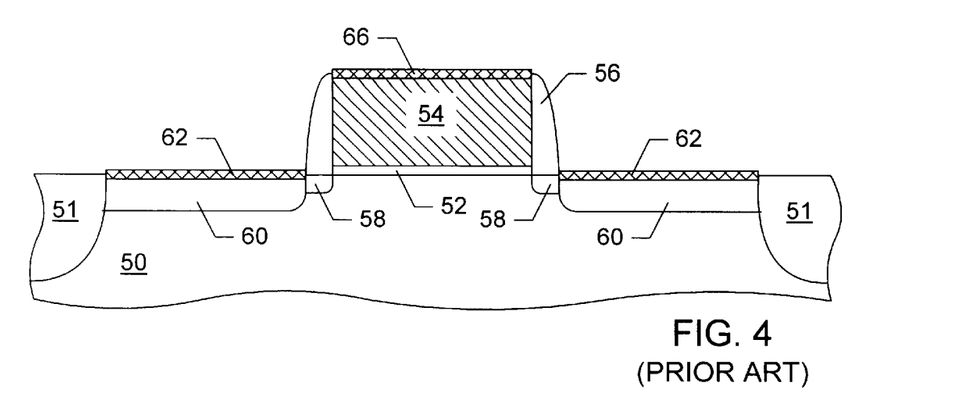
FIG. 4 depicts a partial cross-sectional view of another semiconductor topography according to conventional design, wherein salicide has been formed upon the source and drain regions and the upper surface of a gate conductor of a transistor using a two-step anneal process.
Figure 5:
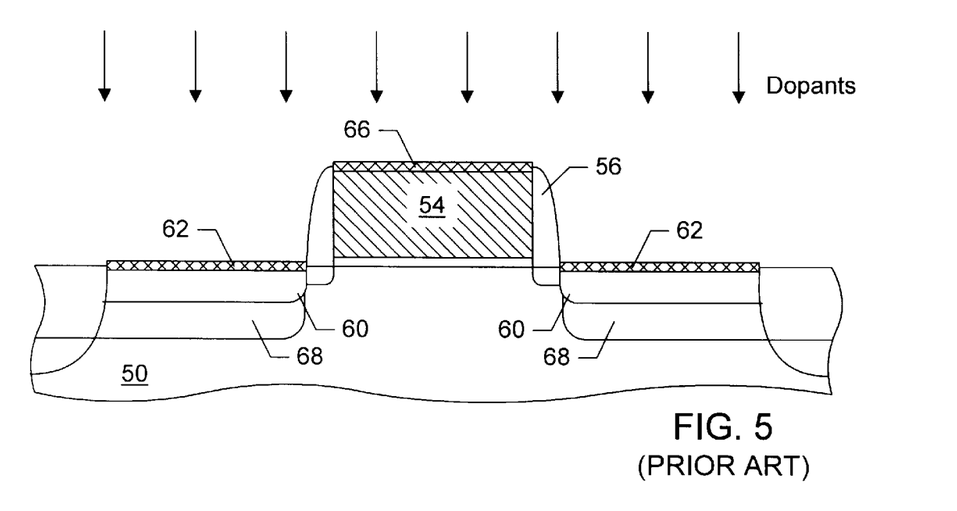
FIG. 5 depicts a partial cross-sectional view of the semiconductor topography, wherein dopant species similar in type to the dopant species residing within the source and drain regions are implanted to a depth below the source and drain regions to form unactivated implant regions.

FIGS. 4–5 illustrate another method which has been employed to counter the consumption of junctions during the salicidation process. FIG. 4 depicts a silicon-based substrate 50 in which trench isolation structures 51 have been formed a spaced distance apart. A transistor has been fabricated upon and within an active area of substrate 50 between trench isolation structures 51. The transistor includes a gate conductor 54, a gate oxide 52, LDD areas 58, and source and drain regions 60. Oxide sidewall spacers are interposed between gate conductor 54 and source and drain regions 60. Salicide structures 62 and polycide structure 66 are formed according to the two-step anneal process described above. As shown in FIG. 5, dopant species similar in type to those residing within source and drain regions 60 are implanted at a relatively high energy into regions of the substrate below source and drain regions 60. In this manner, unactivated junction areas 68 are formed beneath activated source and drain regions 60. Even though metal may have penetrated all the way through source and drain regions 60 during silicide formation, the presence of unactivated junction areas 68 prevents the metal from contacting the oppositely doped bulk substrate 50.

One drawback of forming unactivated junction areas is that additional masking steps are required to implant p-type species exclusively into active areas occupied by PMOS transistors and n-type species exclusively into active areas occupied by NMOS transistors. That is, the NMOS transistors must be masked during the implant of p-type species, and vice versa. The additional masking steps would add to the overall time required to produce each integrated circuit device, decreasing the throughput of the integrated circuit manufacturer. In addition to this drawback, relatively large dopant species, e.g., arsenic, implanted through the silicide may strike metal atoms (e.g., Co or Ti) at a force sufficient to dislodge the atoms. Consequently, the metal atoms may be repelled into the channel region of substrate 50 underneath gate conductor 54. Unfortunately, the presence of the metal atoms within the channel could increase the subthreshold current of the transistor in its off-state.

It would therefore be desirable to develop a process for forming a salicide without being concerned that excessive consumption of the junctions might lead to junction spiking. Further, salicide formation upon the sidewall spacers laterally adjacent the gate conductor must be eliminated to ensure that silicide bridging between the gate conductor and the junctions does not occur. Accordingly, the sidewall spacers must be maintained absent of silicon atoms other than those bonded within the spacers. Also, formation of contacts to relatively shallow junctions must not be performed at the expense of increasing the leakage of current between the junctions. As such, implanting additional dopant species through the salicide should be avoided to prevent metal atoms of the salicide from being knocked into the channel.

SUMMARY OF THE INVENTION

The problems outlined above are in large part solved by the technique hereof for forming salicide upon junctions without excessive consumption of the junctions. That is, silicon is implanted into select areas of a refractory metal to reduce the consumption of silicon-based junctions underlying those select areas during salicide formation. The refractory metal is subjected to a heat cycle to form salicide upon the junctions and polycide upon the upper surface of a gate conductor positioned between the junctions.

In response to being heated, the metal atoms readily react with implanted silicon atoms positioned proximate the metal atoms to form salicide. Once a metal atom has reacted with implanted silicon atoms, it is no longer available to react with silicon atoms of the junctions. However, not all of the metal atoms react with implanted silicon atoms, so some of the metal atoms are free to react with the silicon atoms of the junctions. Interdiffusion and reaction between those available metal atoms and those silicon atoms of the junctions occurs as a result of heating the semiconductor topography. The junctions thus may be partially consumed, ensuring that a low resistance pathway is formed between the salicide and the junctions. Advantageously, the remaining portions of the junctions are sufficiently large to prevent junction spiking entirely through the junctions to the bulk substrate underlying the junctions. In fact, so little of the junctions are consumed during salicide formation that the junction depth may be minimized without suffering increased junction leakage due to junction spiking.

According to a preferred embodiment, a silicon-based substrate is provided upon and within which a transistor has been formed. The transistor includes a polysilicon gate conductor spaced above the substrate by a gate dielectric and a pair of dielectric sidewall spacers extending laterally from the opposed sidewall surfaces of the gate conductor.

The spacers may be composed of oxide or silicon nitride ("nitride"). An LDD area is arranged within the substrate directly beneath the dielectric sidewall spacers, and source and drain regions are arranged within the substrate laterally adjacent the LDD areas. The source and drain regions are spaced laterally from the gate conductor by the dielectric sidewall spacers as well as the LDD areas. Any materials, e.g., oxide, previously formed upon the source and drain regions and the upper surface of the gate conductor have been removed. In one embodiment, Group IVA atoms, preferably Si or Ge, are implanted into upper regions of the source and drain regions and the gate conductor to amorphize those regions. That is, the crystalline lattice in the upper regions of the source and drain regions and the gate conductor are damaged such that the regularity of the Si atoms is reduced. Consequently, migration pathways are created through the now-amorphous upper regions of the source and drain regions and the gate conductors. The presence of amorphous regions proximate the upper surfaces of the gate conductor and the source and drain regions promotes interdiffusion between Si atoms therein and metal atoms subsequently deposited across those surfaces.

A layer of metal is then deposited across the exposed surfaces of the semiconductor topography. Appropriate metals include, but are not limited to, titanium (Ti) and the Group VIII metals, i.e., cobalt (Co), platinum (Pt), palladium (Pd), and nickel (Ni). The more preferred metals are Co and Ti which can be used to form silicides that exhibit relatively low resistivities. A masking layer is then patterned upon areas of the metal exclusive of the metal arranged directly above the upper surfaces of the source and drain regions. Thereafter, Si atoms are implanted into the uncovered portions of the metal. After removing the masking layer from the metal, the substrate may be heated to a first temperature of, e.g. 600° C. to 700° C., to allow for a first phase of salicide (e.g., $TiSi_2$ or $CoSi_2$) to form upon the source and drain regions and the gate conductor (in the form of polycide). As a result of the low temperature anneal, the metal atoms overlying the source and drain regions readily react with nearby implanted Si atoms. It is believed, however, that even metal atoms react with the Si atoms within the source and drain regions since interdiffusion between those atoms must occur before they can react. The metal atoms overlying the gate conductor are absent of implanted Si atoms, and thus only react with Si atoms within the gate conductor. The metal arranged upon the dielectric sidewall spacers is deliberately left void of implanted Si atoms to prevent the formation of a silicide short between the gate conductor and the source and drain regions.

The metal not converted into salicide is then etched from the topography using, e.g., a wet etch which exhibits high selectivity for that metal relative to the salicide. Subsequently, the silicon-based substrate is subjected to a second temperature greater than the first temperature to convert the first phase of the salicide into a second phase having a lower resistivity than the first phase. Preferably, the second temperature is greater than about 800° C. During the second anneal step, interdiffusion between the metal atoms and Si atoms within the junctions and the gate conductor is increased. Thus, more reactions may take place between the metal atoms and the Si atoms. Although the source and drain regions may be partially consumed, the additional implanted Si atoms afford reduced consumption of the source and drain regions. A larger portion of the gate conductor may be consumed by polycide which lowers the resistance of the gate conductor. If the source and drain regions and the gate conductor include amorphous upper regions, interdiffusion between the metal atoms and the Si atoms in the source and drain regions and the gate conductor will be enhanced. That is, more migration avenues within the amorphous regions are available to the metal atoms and the Si atoms. As such, the sheet resistance at the interfaces between the salicide and the source and drain regions and between the polycide and the gate conductor is reduced by the presence of the amorphous upper regions. Since metal has been removed from upon the dielectric sidewall spacers, no silicide can form upon the spacers during the high temperature anneal step.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 6:
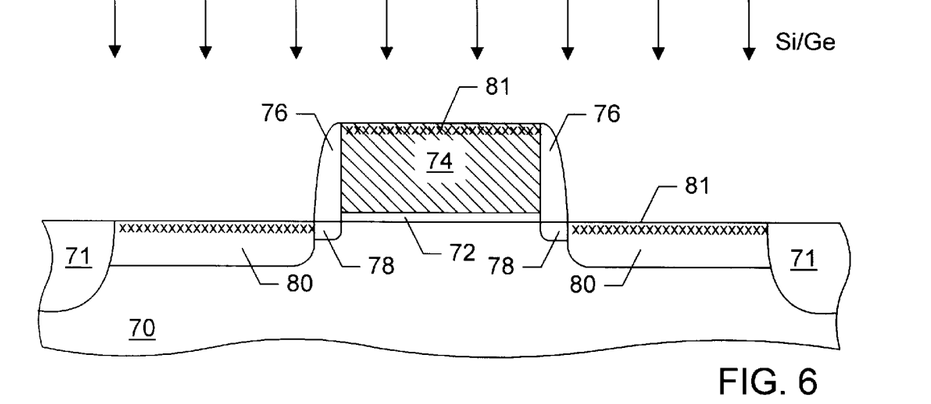
FIG. 6 depicts a partial cross-sectional view of a semiconductor topography according to an embodiment of the present invention, wherein Si or Ge atoms are implanted into upper portions of the source and drain regions and the gate conductor of a transistor.

Turning to FIG. 6, a partial cross-sectional view of a semiconductor substrate 70 is depicted. Substrates 70 preferably comprises single crystalline silicon which has been slightly doped with n-type or p-type impurities. Trench isolation structures 71 are arranged a spaced distance apart within field regions of substrate 71. Trench isolation structures 71 serve to isolate a transistor residing within the active region interposed between the isolation structures. Alternatively, trench isolation structures 71 may be replaced with LOCOS structures. The transistor arranged within the active region of substrate 70 includes a gate dielectric 72 residing upon the upper surface of the substrate. Gate dielectric 72 may comprise, e.g., oxide. A polysilicon gate conductor 74 bounded between a pair of opposed sidewall surfaces is arranged upon gate dielectric 72. A pair of dielectric sidewall spacers 76 composed of, e.g., oxide or nitride extend laterally from the opposed sidewall surfaces of gate conductor 74.

LDD areas 78 are arranged within substrate 70 directly beneath sidewall spacers 76. Also, source and drain regions 80 are spaced laterally from gate conductor 74 by LDD areas 78. LDD areas 78 and source and drain regions 80 form graded junctions which increase in dopant concentration in a lateral direction away from gate conductor 74. The dopant species positioned within LDD areas 78 and source and drain regions 80 are opposite in type to those residing in the bulk substrate 70. In an alternate embodiment, LDD areas 78 and source and drain regions 80 may reside within a p-type or n-type well formed in substrate 70. Such well regions would provide for the formation of a CMOS integrated circuit having both NMOSFET and PMOSFET transistors. FIG. 6 depicts the implantation of Si or Ge atoms to a relatively shallow depth into the semiconductor topography so as to form amorphous regions 81 within source and drain regions 80 and gate conductor 74. Other Group IVA atoms besides Si and Ge may alternately be implanted into the topography. It is to be understood that the implantation step depicted in FIG. 6 is optional and may be performed to lower the sheet resistance of the interface between source and drain regions 80 and salicide subsequently formed upon the source and drain regions.

Figure 7:
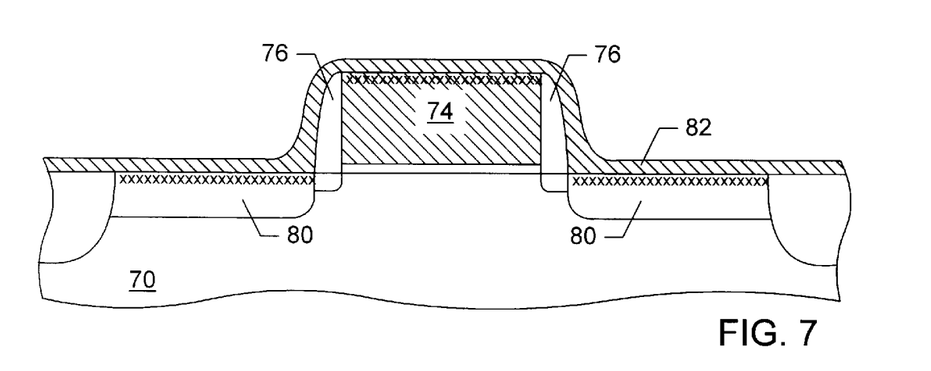
FIG. 7 depicts a partial cross-sectional view of the semiconductor topography, wherein metal layer is deposited across the transistor, subsequent to the step in FIG. 6.
Figure 8:
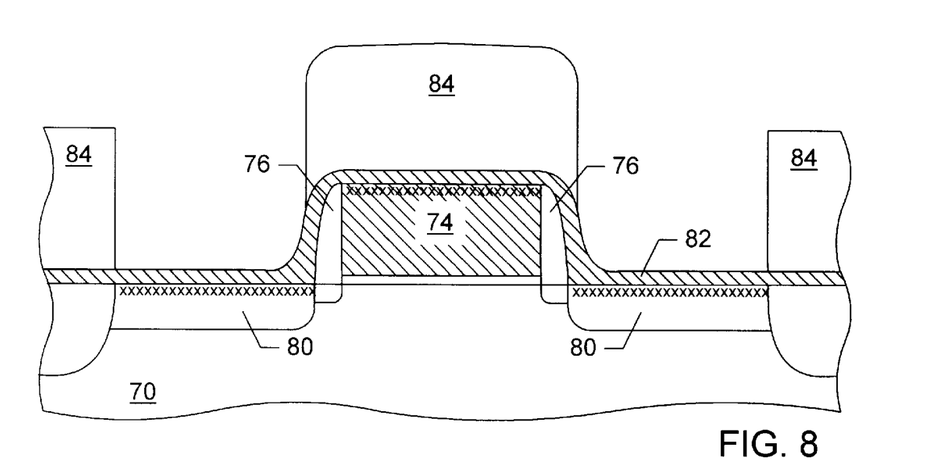
FIG. 8 depicts a partial cross-sectional view of the semiconductor topography, wherein a masking layer is formed upon areas of the metal layer exclusive of the metal residing directly above the source and drain regions, subsequent to the step in FIG. 7.
Figure 9:
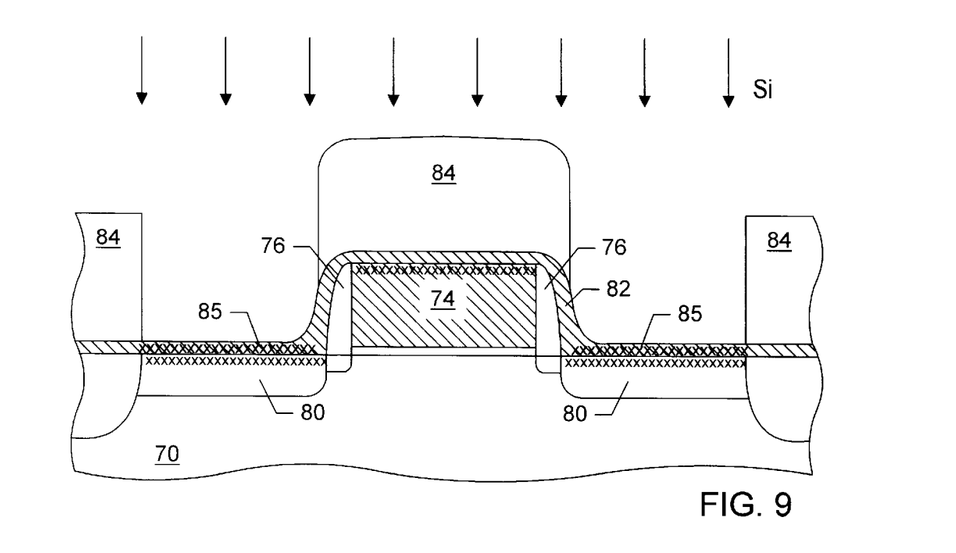
FIG. 9 depicts a partial cross-sectional view of the semiconductor topography, wherein Si atoms are implanted into areas of the metal layer residing directly above the source and drain regions, subsequent to the step in FIG. 8.

As shown in FIG. 7, a refractory metal 82 is then deposited across the semiconductor using, e.g., physical vapor deposition ("PVD") from a metal target. Metal 82 is preferably Co or Ti, but may also be other metals, such as one of the Group VIII metals. The thickness of the layer of metal 82 formed upon the topography may be, e.g., 250 to 450 Å. Turning to FIG. 8, a masking layer 84 is then formed upon areas of metal 82 exclusive of the metal residing directly above source and drain regions 80. Masking layer 84 preferably comprises photoresist which is patterned using a well-known optical lithography process. Masking layer 84 may alternately comprise any material which is patterned by etching away select portions of the material not covered by a photoresist. As shown in FIG. 9, Si atoms are subsequently implanted into the regions of metal 82 not covered by photoresist 84 to form heavily concentrated Si areas 85 within metal 82. The implant is performed at a relatively low energy of, e.g., less than 20 kEV, and at a relatively high dose of, e.g., 1E-15 to 1E-17 $cm^2/s$, so as to incorporate a high concentration of Si atoms into the entire thickness of the exposed regions of metal 82.

Figure 10:
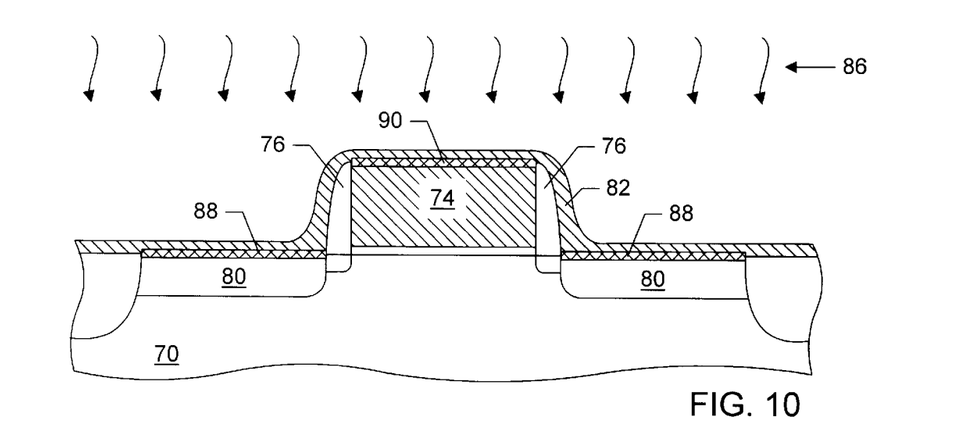
FIG. 10 depicts a partial cross-sectional view of the semiconductor topography, wherein the topography is heated to a first temperature to cause a first phase of salicide to form upon the source and drain regions and the gate conductor, subsequent to the step in FIG. 9.
Figure 11:
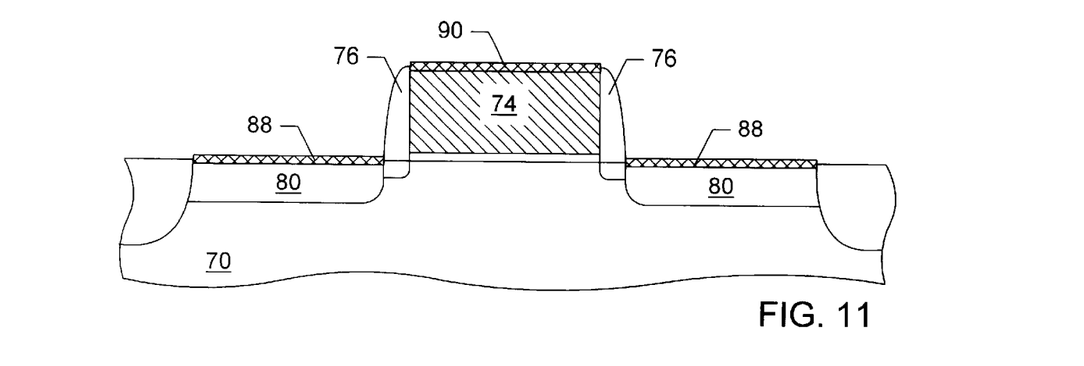
FIG. 11 depicts a partial cross-sectional view of the semiconductor topography, wherein unreacted portions of the metal are removed from the topography, subsequent to the step in FIG. 10.

FIG. 10 illustrates a first anneal step in which the semiconductor topography is heated to a temperature of approximately 600° C. to 700° C. by exposing it to a form of radiation 86. Radiation 86 is preferably radiant light supplied from e.g., an arc lamp or a tungsten-halogen lamp using a technique known as rapid thermal processing ("RTP"). The use of RTP to heat metal 82 may reduce the amount of diffusion of the metal atoms into dielectric spacers 76. Alternatively, radiation 86 may be thermal radiation provided from a heated furnace. As a result of the anneal step, metal atoms within metal 82 react with the implanted Si atoms and with Si atoms of source and drain regions 80 and gate conductor 74. In this manner, a first phase of silicide (e.g., $TiSi_2$ or $CoSi_2$) is formed upon exposed underlying surfaces primarily composed of silicon. That is, salicide structures 88 are formed upon source and drain regions 80, and polycide structure 90 is formed upon the upper surface of gate conductor 74. Unreacted portions of metal 82 are then removed using a selective etch technique, as shown in FIG. 11. For example, if metal 82 comprises titanium, it may be etched in a 5:1:1 mixture of deionized $H_2O$, 30% $H_2O_2$, and $NH_4OH$. In this manner, metal 82 is cleared from dielectric sidewall spacers 76 to prevent formation of silicide upon the spacers in a subsequent annealing step.

Figure 12:
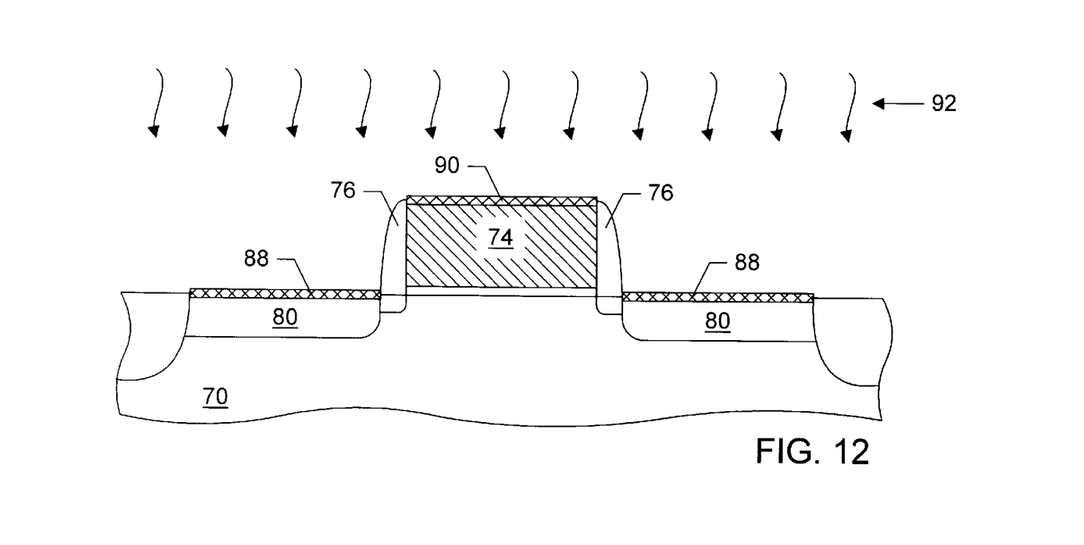
FIG. 12 depicts a partial cross-sectional view of the semiconductor topography, wherein the substrate is heated to a second temperature greater than the first temperature to convert the first phase of the salicide into a second phase having a lower resistivity than the first phase, subsequent to the step in FIG. 11.

Turning to FIG. 12, the semiconductor topography is then heated to a temperature greater than, e.g., about 800° C., to change the salicide from the first phase to a second phase having a lower resistivity than the first phase. Radiation 92 supplied from either an RTP chamber or a conventional furnace is used to heat the topography. Although source and drain regions 80 are partially consumed during the two-step anneal process, the amount of consumption is less than in conventional salicide processes. If amorphous regions are created within source and drain regions 80, the junction consumption is reduced by about 25–30 Å as compared to conventional methods. The amount of consumption is reduced by about 100 Å if no amorphous regions reside within source and drain regions 80. While the consumption of source and drain regions 80 may be greater if they are absent of amorphous regions, the formation of such amorphous regions advantageously affords lower sheet resistance at the interface between source and drain regions 80 and salicide structures 88. The thickness of polysilicon gate conductor 74 that is consumed is greater than that consumed in source and drain regions 80 because no Si atoms are implanted into the metal overlying gate conductor 74. The implantation of Si atoms into a silicide-forming metal arranged upon a junction therefore provides for reduced consumption of the junction during salicide formation. As such, the junction is less likely to experience junction spiking, and hence current leakage.

It will be appreciated to those skilled in the art having the benefit of this disclosure that this invention is believed to provide a method for implanting silicon into select areas of a refractory metal to reduce the consumption of silicon-based junctions underlying those select areas during salicide formation. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A contact structure comprising:
    a source region and a drain region spaced from respective opposed sidewall surfaces of a gate conductor by a respective pair of dielectric sidewall spacers; and a silicide residing upon the source and drain regions, wherein the silicide comprises metal atoms of a metal layer bonded with implanted silicon atoms which reside primarily within the metal layer above the source and drain regions, wherein the implanted silicon atoms within the metal layer extend across substantially an entire upper surface of the source and drain regions not covered by the dielectric sidewall spacers, and wherein the dielectric sidewall spacers are substantially free of the implanted silicon atoms.

2. The contact structure of claim 1, wherein the gate conductor comprises polycrystalline silicon, and further comprising a polycide residing upon an upper surface of the gate conductor.

3. The contact structure of claim 2, wherein the source and drain regions are arranged within a silicon-based substrate.

4. The contact structure of claim 3, wherein the metal silicide extends below an upper surface of the substrate by a first distance, and wherein the source and drain regions extend below the upper surface of the substrate by a second distance substantially greater than the first distance.

5. The contact structure of claim 1, wherein the metal layer comprises a refractory metal selected from the group consisting of Ti and Co.

6. The contact structure of claim 1, wherein the silicide comprises $TiSi_2$ or $CoSi_2$.

* * * * *